United States Patent [19]

Kobayashi et al.

[11] Patent Number: 4,939,365

[45] Date of Patent: Jul. 3, 1990

[54] AUTOMATIC PRELIMINARY IRRADIATION APPARATUS IN TRANSMISSION ELECTRON MICROSCOPE

[75] Inventors: Hiroyuki Kobayashi, Mito; Teruo Suzuki, Chigasaki; Akio Mori, Katsuta; Sadahiko Okamura, Katsuta; Shoji Kamimura, Katsuta, all of Japan

[73] Assignees: Hitachi, Ltd., Tokyo; Hitachi Instrument Engineering Co., Ltd., Ibaraki, both of Japan

[21] Appl. No.: 238,141

[22] Filed: Aug. 30, 1988

[30] Foreign Application Priority Data

Sep. 2, 1987 [JP] Japan .................................. 62-217872

[51] Int. Cl.⁵ ............................................. H01J 37/147
[52] U.S. Cl. .................................. 250/311; 250/396 R
[58] Field of Search ................ 250/306, 311, 397, 398, 250/492.22, 492.23, 396 R

[56] References Cited

U.S. PATENT DOCUMENTS

| | | | |
|---|---|---|---|
| 3,956,635 | 5/1976 | Chang | 250/492.23 |
| 3,978,338 | 8/1976 | Ueno et al. | 250/396 R |
| 4,321,510 | 3/1982 | Takigawa et al. | 250/397 |
| 4,424,448 | 1/1984 | Takigawa et al. | 250/397 |
| 4,445,039 | 4/1984 | Yew | 250/492.22 |
| 4,547,669 | 10/1985 | Nakagawa et al. | 250/397 |
| 4,586,141 | 4/1986 | Yasuda et al. | 250/492.22 |

OTHER PUBLICATIONS

"Electron Microscope Observation Method" edited by Japan Society of Electron Microscopy, p. 90, no translation.

*Primary Examiner*—Bruce C. Anderson
*Attorney, Agent, or Firm*—Antonelli, Terry, Stout & Kraus

[57] ABSTRACT

A transmission electron microscope for irradiating a specimen with an electron beam, wherein the electron beam passed through the specimen is imaged on an imaging screen by a magnifying lens system. The electron microscope includes a deflector for deflecting the electron beam to thereby scan a specimen with the electron beam, and a memory for storing a range within which the specimen is to be preliminarily scanned with the electron beams and the number of scans to be performed. The specimen is preliminarily scanned with the electron beam within the preliminary scan range for the number of times on the basis of the corresponding data read out from the memory.

12 Claims, 4 Drawing Sheets

AUTOMATIC PRELIMINARY IRRADIATION APPARATUS IN TRANSMISSION ELECTRON MICROSCOPE

BACKGROUND OF THE INVENTION

The present invention relates to an automatic preliminary irradiation apparatus in a transmission electron microscope.

In the transmission electron microscope, a specimen undergoes remarkable injuries when irradiated with an electron beam, making it difficult to view and take a picture of the true aspect or structure of the specimen. When a slice of the specimen or a supporting film therefor is feeble, shrinkage is likely to take place in the region of the specimen irradiated with the electron beam, giving rise to a so-called "drift of specimen" and rupture thereof.

In order to protect a specimen against the drift and the rupture in the course of observation and/or photographing of the image, it is known to irradiate preliminarily the specimen with an electron beam of a low intensity preceding to the viewing and/or photographing, so that the slice of specimen and the supporting film may get familiar with the electron beam to be thereby stabilized, as is discussed in Japanese literature entitled "Electron Microscope Observation Method" editted by Japan Society of Electron Microscopy, p. 90. The preliminary irradiation is manually performed by operator with the aid of a specimen fine-moving device such that the specimen (exposed through a grid hole or mesh) is uniformly and thoroughly irradiated with the electron beam having the intensity decreased sufficiently. More specifically, the preliminary irradiation is started by scanning the specimen initially with the electron beam of a low intensity, and then the intensity of the electron beam is progressibly increased while moving the specimen by means of the fine-moving device every time the beam intensity is increased.

Needless to say, the preliminary irradiation performed manually and repeatedly requires not only high skillful on the part of the operator but also a lot of time and labor.

SUMMARY OF THE INVENTION

Accordingly, it is an object of the present invention to provide a transmission electron microscope in which preliminary irradiation of a specimen can be automatically performed to thereby reduce the time consumption and labor involved in the manual irradiation described above.

With the above object in view, there is provided according to an aspect of the present invention a transmission electron microscope provided with a means for deflecting an electron beam to scan a specimen with the electron beam, and a memory means for storing the range within which the specimen is to be scanned with the electron beam as well as the number of times the scanning is to be performed, wherein the specimen is scanned with the electron beam for the preliminary irradiation within the preset range and the number of times as read out from the memory.

With the arrangement described above, the range of a specimen for preliminary irradiation by scanning with the electron beam as well as the number of times the scanning is performed can be read out by inputting corresponding commands, whereupon the specimen is scanned with the electron beam within the range read out from the memory, the number of times also being read out therefrom. In this way, preliminary irradiation of the specimen with the electron beam can automatically be carried out.

DESCRIPTION OF THE PREFERRED EMBODIMENTS

Figure 1:
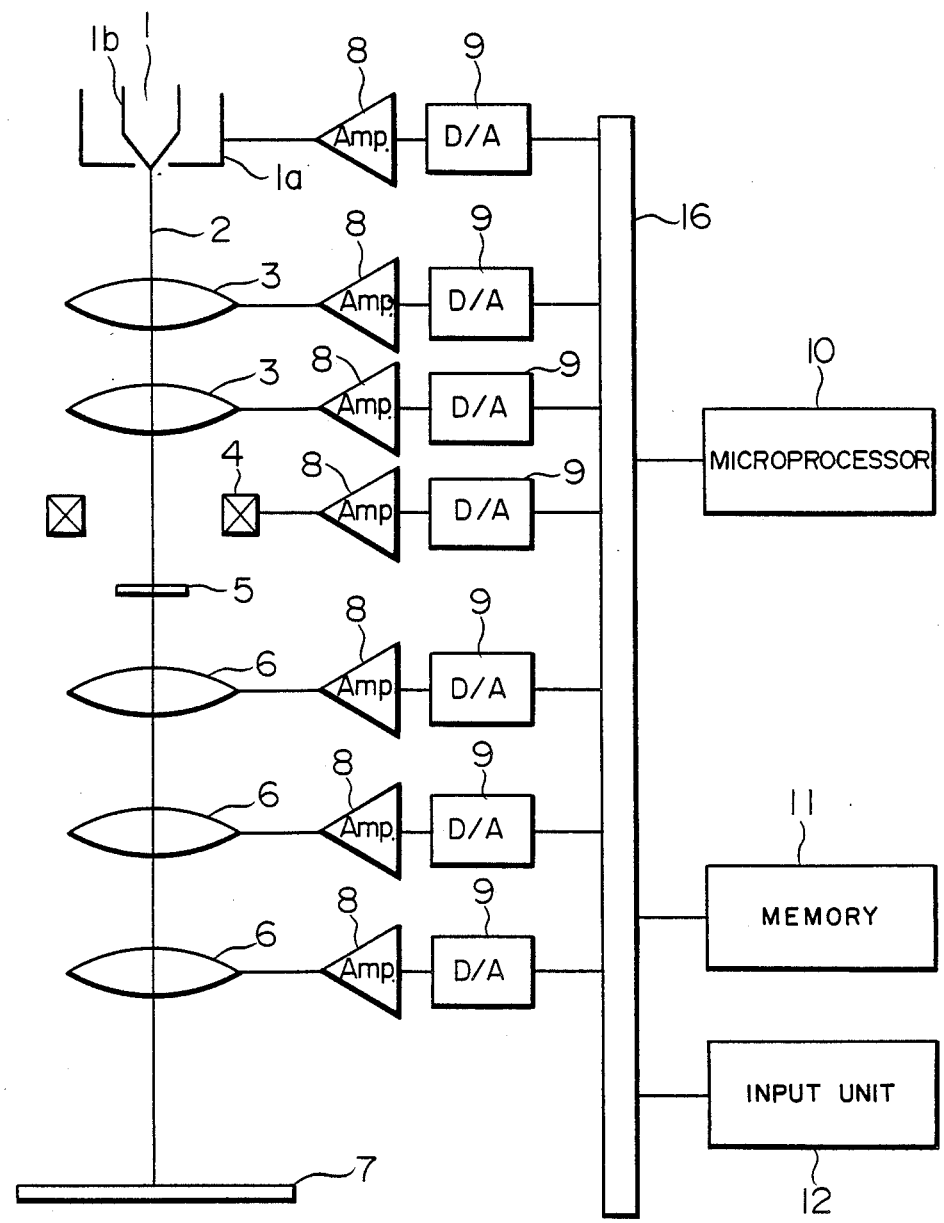
FIG. 1 is a block diagram showing a general arrangement of a transmission electron microscope according to an embodiment of the invention.

FIG. 1 shows schematically a structure of a transmission electron microscope to which the present invention is applied. Referring to the figure, an electron beam 2 emitted from an electron gun including a cathode 1a and a filament 1b is focused by a two-stage illuminating (condenser) lens system 3 to irradiate a specimen 5. The electron beam 2 passed through the specimen 5 is magnified by a three-stage imaging lens system 6 to form an image of the specimen 5 on a fluorescent screen 7 disposed on the image forming plane. An electron beam deflector 4 includes deflecting coils for deflecting the electron beam and additionally an alignment coil for aligning the optical axis of the illuminating lens system 3 with that of the imaging lens system 6 to thereby eliminate possible deviation between these axes. Each of the lens systems 3 and the electron beam deflector 4 are connected to a microprocessor 10 through associated amplifiers 8 and D/A (digital-to-analogue) converters 9, respectively, to a microprocessor 10 so that coil currents of the lens systems and the beam deflector can be controlled independent of one another by the microprocessor 10.

Figure 2:
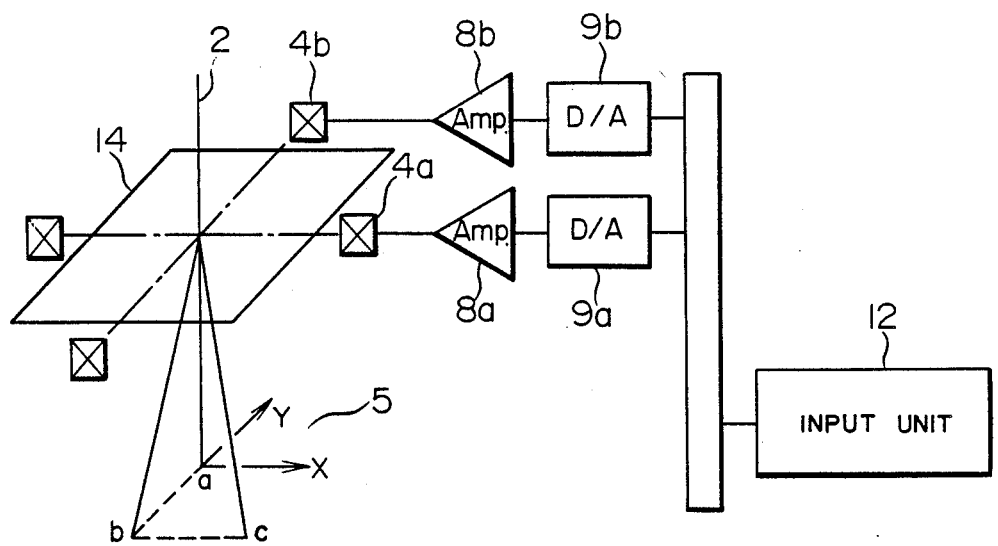
FIG. 2 is a diagram for illustrating a method of setting a scan range for an electron beam deflector shown in FIG. 1.

FIG. 2 shows schematically a structural arrangement of the electron beam deflector 4. As will be seen in the figure, the electron beam deflector 4 includes a deflection coil 4a for deflecting the electron beam in the X-direction perpendicular to the optical axis (which substantially coincides with the incident direction of the electron beam) and a deflection coil 4b for deflecting the electron beam in the Y-direction extending orthogonally to the X-axis so that magnitude of the deflection of the electron beam 2 can be controlled by controlling magnitude of the currents flowing through the deflection coils 4a and 4b. More specifically, by inputting manually the quantities of deflection through an input unit 12 constituted by a keyboard or an array of knobs, the input quantities are reflected onto the currents applied to the X- and Y-deflection coils 4a and 4b by way of the associated D/A converters 9a and 9b and amplifiers 8a and 8b, respectively. In this manner, the electron beam passing through the X- and Y-deflectors 4a and 4b can be deflected on the X-Y plane 14. The deflecting directions of the electron beam can be varied arbitrarily by varying correspondingly the input quantities for the X- and Y-deflection coils 4a and 4b.

Now, description will be made of a method for setting four coordinate points defining a scan range.

The specimen is disposed on a mesh and observed or viewed for one mesh hole. For the purpose mentioned above, the mesh having no specimen disposed thereon is positioned on a specimen holder of the electron microscope to confirm or detect the position of the electron beam and that of one mesh hole on the fluorescent screen 7 under no deflection.

It is assumed that the electron beam 2 is incident on the specimen 5 at a point a when the beam 2 is not deflected by the X- and Y-deflection coils 4a and 4b. On the assumption, when a quantity of deflection for the Y-deflection coil 4b to cause the electron beam 2 to be deflected in the minus direction is inputted through the input unit 12, the output of the associated D/A converter 9b reflecting the input quantity for the deflection causes the current flowing through the Y-deflection coil to vary correspondingly, as the result of which the electron beam 2 is deflected to illuminate a point b on the surface of the specimen 5. In that case, by varying the output of the D/A converter 9b and hence magnitude of deflection of the electron beam progressively and continuously, the electron beam 2 is so deflected as to move on the specimen along a path defined between the points a and b while illuminating the exposed surface of the specimen (i.e. the specimen is scanned with the electron beam). When a quantity for the deflection along the X-axis in the positive or plus direction is simultaneously inputted, the electron beam 2 is deflected by both the X- and Y-deflection coils 4a, 4b, whereby a point c on the specimen 5 is illuminated by the electron beam 2. In other words, the specimen 5 can be scanned with the electron beam 2 in any desired direction by correspondingly energizing both the X- and Y-deflection coils simultaneously.

Figure 3:
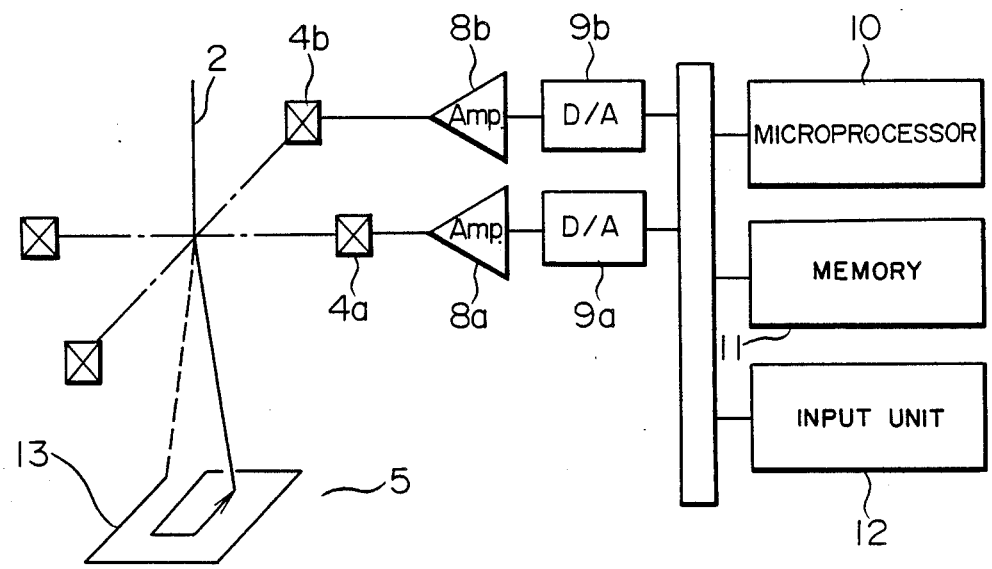
FIG. 3 is a diagram illustrating a method of scanning a specimen with the electron beam by correspondingly controlling the electron beam deflector shown in FIG. 1.

Referring to FIG. 3, four coordinate points which define a range of scanning in the manner described above are sequentially inputted through the input unit 12 to be stored in a memory 11. For effectuating automatically the scanning operation along a scanning path 13 as shown in FIG. 3, the X- and Y-deflection coils 4a and 4b are controlled with the aid of the input unit 12 such that the electron beam can scan the specimen along the path 13, wherein the quantities of deflection at the points where the scanning direction is changed are previously stored in the memory 11 in terms of the X- and Y-coordinates values of these points.

Now, the mesh having a specimen actually disposed thereon is placed on the specimen holder of the electron microscope at a correctly aligned position. The microprocessor 10 reads out from the memory 11 the data of the coordinates of the points on the scanning path at which the scanning direction is to be changed, and controls the currents of the X- and Y-deflectors 4a and 4b through the associated D/A converters 9a and 9b in accordance with the data read out, for thereby deflecting the electron beam so as to follow the scanning path 13. In this fashion, preliminary irradiation of the specimen 5 with the electron beam can be automatically accomplished.

By determining previously the scanning process or pattern for the preliminary irradiation of the specimen with the electron beam (e.g. vortex-like pattern illustrated in FIG. 3) the coordinates of the points at which the scanning direction is to be changed (magnitudes of deflection) can be arithmetically determined by the microprocessor on the basis of the coordinate values and magnitudes of deflection at the first four points on the scanning path 13 (i.e. four successive points from the first, inclusive, at which the scanning direction is changed) and stored in the memory 11. Thus, it is possible to carry out automatically the scanning by simply placing the mesh having the specimen disposed thereon correctly at the specimen position. In other words, for the automatic preliminary irradiation of the specimen along a predetermined path 13, the operator is solely required to store previously the data only of the four points in the memory.

Besides, in conjunction with the preliminary irradiation of the specimen (i.e. irradiation of the specimen 5 within a predetermined range by scanning with the electron beam 2 along the scanning path 13), the time required for the preliminary irradiation can also be stored in the memory 11 with the aid of the input device 12 to thereby allow the time required for the scanning to be controlled by the microprocessor 10 on the basis of the stored value. Besides, the number of times the preliminary irradiation is to be carried out may be previously stored in the memory 11 so that the similar scanning operation can be repeated automatically the number of times desired. These operations will be described in more detail by reference to FIG. 4.

As will now be appreciated, the preliminary irradiation of the specimen can be automatically performed simply by inputting the scanning range over which the preliminary irradiation is to be effected, the time required therefor and the number of times the irradiation is to be repeated by operator of the electron microscope.

Now, the abovementioned operation will be described in detail by referring to FIG. 4 which shows in a flow chart the processing involved.

Figure 4:
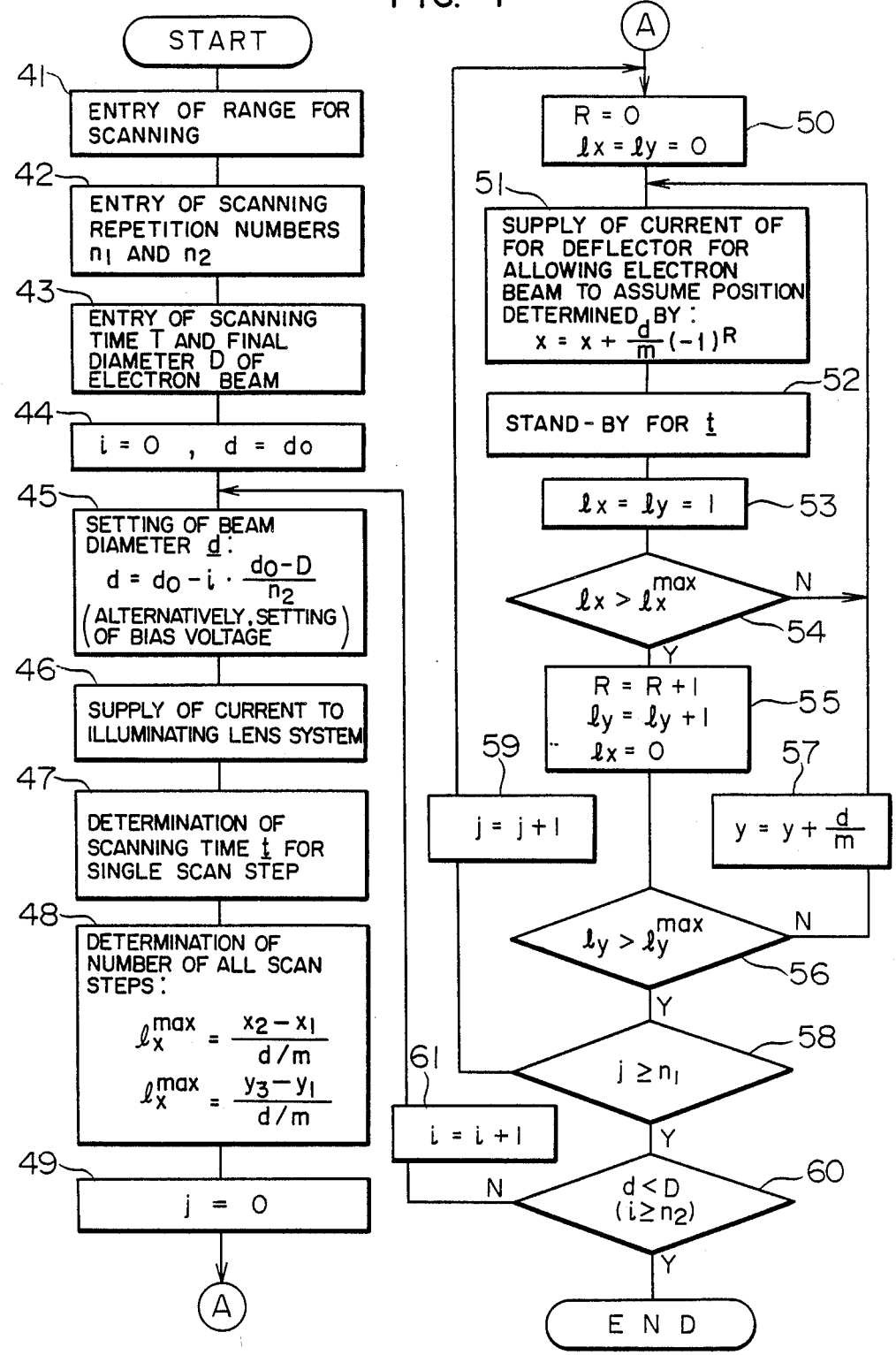
FIG. 4 is a flow chart illustrating processing or operation procedure executed by an automatic preliminary irradiation apparatus according to an embodiment of the invention.

A program for executing the procedure illustrated in FIG. 4 is stored in a ROM (not shown) incorporated in the microprocessor 10. Upon running of the program, a scanning range within which a specimen is to be preliminarily irradiated through scanning with the electron beam is first inputted at a step 41. The setting of the scanning range can be realized by entering the coordinates of four points, for example, $(x_1, y_1)$, $(x_2, y_2)$, $(x_3, y_3)$ and $(x_4, y_4)$, with the aid of the input unit 12 and storing them in the memory 11. For the sake of facilitation of description, it is assumed that the abovementioned coordinates $x_1, \ldots, x_4$ and $y_1, \ldots, y_4$ bear the following relations:

$$\left. \begin{array}{l} x_1 = x_3, x_2 = x_4 \\ y_1 = y_2, y_3 = y_4 \end{array} \right\} \quad (1)$$

Subsequently, at a step 42, the number of times the scanning is to be repeated for the preliminary irradiation is stored in the memory 11 through the input unit 12. With the instant embodiment, it is envisaged that the scanning is initially performed with the electron beam having a large diameter on the surface of the specimen, wherein the diameter of the electron beam is progressively decreased stepwise as the scanning proceeds. More specifically, the scanning with the beam of a same diameter is repeated a number of times $n_1$ and subsequently a number $n_2$ of scannings are performed with different beam diameters, respectively. At the step 42, these two numbers $n_1$ and $n_2$ are entered.

At a step 43, the scanning duration or time T taken for the single cycle of the preliminary irradiation and the diameter D of the electron beam at the end of the single irradiation cycle are entered through the input unit to be stored in the memory 11. The beam diameter D represents the minimum diameter of the electron beam employed in the preliminary irradiation which is so adjusted in respect to the intensity thereof that the specimen can undergo no injury.

At a step 44, the number i of beam diameter setting steps at which the beam diameter is changed each time is set to zero, while the beam diameter generally designated by d is set to the initial beam diameter $d_0$ by inputting a corresponding command through the input unit 12.

At a step 43, the beam diameter d is an arithmetically determined in accordance with $$d = d_0 - i \cdot \frac{d_0 - D}{n_2} \quad (2)$$

Since the number of the beam diameter setting steps i is currently equal to zero, the beam diameter d is held at the initial value entered at the step 44. Subsequently, at a step 46, the current for the illuminating lens system 3 is set so that the diameter of the electron beam assumes the value $d_0$. In this connections, it should be mentioned that relations between the currents of the illuminating lens system 3 and the diameters of the electron beam may previously be determined experimentally and stored in the memory in the form of a table so that the currents to be supplied to the illuminating lens system can be determined simply by referencing the table on the basis of the beam diameter d as set.

At a step 47, the time taken for one step of scanning is determined. In case the scanning with the electron beam is performed stepwise, it is necessary that displacement of the electron beam between the adjacent scanning steps be selected smaller than the beam diameter d so that the areas on the specimen irradiated with the electron beam overlap each other between the adjacent scanning steps. A factor indicating the extent of the overlap is represented by m. By way of example, when m=1, this means that the areas irradiated with the electron beam at given adjacent scanning steps are in contact with each other without overlapping. On the other hand, when m=2, one of the irradiated areas adjacent to each other has a periphery which coincides with the center line of the other area. Further, when m=3, the centers of the adjacent areas undergone irradiation is distanced by d/3. In general, the displacement of the electron beam between the given adjacent scanning steps is represented by d/m. Accordingly, the number of the scanning steps $l_x^{max}$ in the X-direction is given by the following expression (3):

$$l_x^{max} = \frac{x_2 - x_1}{d/m} \quad (3)$$

Similarly, the number of the scan steps in the Y-direction $l_y^{max}$ is given by $$l_y^{max} = \frac{y_1 - y_3}{d/m} \quad (4)$$

Therefore, the total number of the scan steps $S_t$ in both the X- and Y-directions can be expressed as follows:

$$S_t = \frac{m^2}{d^2} (x_2 - x_1)(y_1 - y_3) \quad (5)$$

Since the time taken for the single irradiation cycle is represented by T, the time taken for one scan step t is $T/S_t$ and expressed as follows:

$$t = \frac{T \cdot (d/m)^2}{(x_2 - x_1)(y_1 - y_3)} \quad (6)$$

At a step 47, the time t taken for the one step of scanning is arithmetically determined inaccordance with the above expression (6).

At a step 48, the number $l_x^{max}$ of the scan steps in the X-direction and the number $l_y^{max}$ of the scan steps in the Y-direction are arithmetically determined in accordance with the expressions (3) and (4), respectively. At a step 49, the number i of the scannings in which the electron beam of a same diameter is employed is reset to zero.

Figure 5:
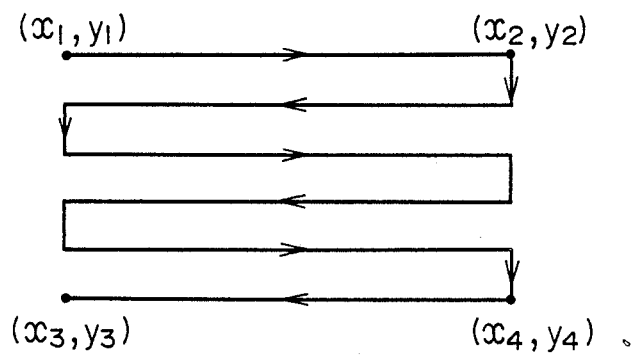
FIG. 5 is a view illustrating a scanning process differing from that shown in FIG. 3.

According to the embodiment now under consideration, the scanning is carried out in a zig-sag or meandering pattern shown in FIG. 5 rather than the vortex-like pattern shown in FIG. 3. As will be seen in this figure, the scannings along the X-axis become different in respect to the direction at every scanning. Accordingly, the quantity R determining the direction in the scanning along the X-axis is initially set to zero while the numbers of $l_{x6}$ and $l_y$ of the scan steps along the X- and Y-axes (in the X- and Y-directions), respectively, are also set to zero at a step 50.

At a step 51, the deflection coils 4a and 4b are supplied with respective currents regulated such that the center of the electron beam is positioned at the current scan point given by (x, y). At present, the starting point of scanning is positioned at the coordinates $(x_1, y_1)$ From this point on, the scan point is moved by d/m upon every scanning step. At a step 52, the stand-by time corresponding to that required for one scanning step (t) is set for every stepwise movement of the scan point. At a step 53, the number of the scanning steps in the X-direction is incremented by "1". At a step 54, decision is made as to whether the number of scanning steps executed in the X-direction has exceeded the total scan step number $l_x^{max}$ or not. If this decision step 54 results in "NO" (negative), the step 51 is regained, whereupon the scanning position in the X-direction is incremented by d/m and execution of the steps 51 to 54 is repeated in similar fashion.

In case the decision step 54 results in "YES" (affirmative), this means that the electron beam has reached the coordinate point $(x_2, y_2)$ located at the end of the rightward scanning on the uppermost linear path shown in FIG. 5. Accordingly, the processing proceeds to a step 55 where the quantity R determining the sign of the X-direction (i.e. the scan direction along the X-axis) is incremented by "1" with the step number $l_y$ in the Y-direction being also incremented by "1", while the step number $l_x$ in the X-direction is reset to zero. At a step 56, decision is made as to the step number $l_y$ in the Y-direction has exceeded the total step number $l_y^{max}$ or not. Since the current scan is the first in the Y-direction, the decision step 56 manifestly results in "NO". Accordingly, at a step 57, the electron beam is moved in the Y-direction by d/m, whereupon the step 51 is regained.

Since the X-coordinate is currently "$x_2$" and since $R=1$, the X-coordinate value is decremented by d/m every time the step 51 is regained.

When the decision step 56 results in "YES", this means that the first scanning cycle has been completed. Accordingly, it is decided at a step 58 whether the number of scan times j the specimen was irradiated with the electron beam of the same diameter has reached the preset value $n_1$ If this decision step 58 results in "NO", the scan step number is incremented by "1" at a step 59, whereupon the step 50 is regained to repeat the scanning. On the other hand, when the decision step 58 results in "YES", this means that the scanning with the electron beam of the same diameter has come to an end. Then, the procedure proceeds to a step 60.

At the step 60, it is decided whether or not the beam diameter d is smaller than the final beam diameter D. Parenthetically, the decision at the step 60 may alternately be made as to whether the beam diameter setting step number i has attained or not the preset value $n_2$.

When the decision step 60 results in "NO", the value i is incremented at a step 61, whereupon the step 45 is regained. At this step 45, the beam diameter d is reduced by $(d_o-D)/n_2$ In other words, the value of d is determined in accordance with the expression (2). Subsequently, the scanning with the beam of the updated diameter is repeated the preset number of times $n_1$ in similar fashion. When the decision step 60 results in "YES", this means that the whole preliminary irradiation has been completed.

As will be appreciated from the foregoing description, the invention teaches that the specimen is initially irradiated with the electron beam of a large diameter, which is progressively decreased to thereby increase correspondingly the electron density of the beam, whereby the specimen is caused to adapt itself to the irradiation by the electron beam.

In the foregoing description, it has been assumed that the beam diameter is progressively decreased for correspondingly increasing the electron density in the beam. It should however be appreciated that the similar effect can be obtained by varying the bias voltage applied to the cathode 1a shown in FIG. 1 without varying the diameter of the electron beam. In that case, the contents of the step 45 may be so altered that the bias voltage is stepwise increased progressibly, while the value i in the step 60 is regarded to represent the number of times the bias voltage is set with $n_2$ representing the number of changes in the bias voltage.

It should be added that instead of performing the scanning with the electron beam, the diameter thereof may wherein the electron density is increased progressively stepwise starting from a small value by correspondingly varying the current of the illuminating lens system or the bias voltage in the course of the preliminary irradiation of the specimen with the electron beam.

We claim:

1. A preliminary irradiation apparatus for a transmission electron microscope, comprising:

means for illuminating a specimen with an electron beam;

electron beam intensity adjusting means for adjusting the intensity of the electron beam of said illuminating means to an intensity required for preliminary irradiation;

electron beam deflecting means for deflecting said electron beam to thereby scan said specimen over a surface thereof with said electron beam;

scan range setting means for setting a scanning range within which said specimen is to be scanned with said electron beam;

scan number setting means for setting the number of times said scanning with said electron beam is to be performed, said electron beam intensity adjusting means enabling an increase of the electron beam intensity in accordance with the number of times of said scanning, while maintaining the electron beam intensity during each time of scanning; and control means for controlling said deflection means so that said specimen is scanned with said electron beam within said scanning range set by said scan range setting means the number of times set by said scan number setting means.

2. A preliminary irradiation apparatus for a transmission electron microscope, comprising:

means for illuminating a specimen with an electron beam;

electron beam intensity adjusting means for adjusting the intensity of the electron beam of said illuminating means to an intensity required for preliminary irradiation, said electron beam intensity adjusting means includes beam intensity increasing means for increasing the intensity of said electron beam at least once in the scanning;

electron beam deflecting means for deflecting said electron beam to thereby scan said specimen over a surface thereof with said electron beam;

scan range setting means for setting a scanning range within said specimen is to be scanned with said electron beam;

scan number setting means for setting the number of times said scanning with said electron beam is to be performed; and control means for controlling said deflection means so that said specimen is scanned with said electron beam within said scanning range set by said scan range setting means the number of times set by said scan number setting means.

3. A preliminary illumination apparatus according to claim 2, wherein said electron beam intensity increasing means includes current varying means for varying a current supplied to an illuminating lens system included in said illuminating means at least once in the scanning.

4. A preliminary illumination apparatus according to claim 2, wherein said electron beam intensity increasing means includes bias voltage varying means for varying a bias voltage of said electron gun included in said illuminating means at least once in the scanning.

5. A preliminary irradiation apparatus according to claim 2, wherein said electron beam intensity adjusting means enables an increase of the electron beam intensity in accordance with the number of times of said scanning, while maintaining the electron beam intensity during each time of scanning.

6. A preliminary illumination apparatus according to claim 1, wherein said electron beam intensity adjusting means includes beam diameter control means for adjusting the intensity of said electron beam to an intensity suited for the preliminary irradiation by enlarging the diameter of said electron beam through corresponding adjustment of the current supplied to the illuminating lens coils included in said illuminating means.

7. A preliminary illumination apparatus according to claim 6, wherein said control means includes inter-scan distance setting means for setting distance between adjacent scanning lines in accordance with the diameter of the electron beam set by said electron beam intensity adjusting means.

8. A preliminary illumination apparatus according to claim 7, wherein said inter-scan distance setting means includes means for setting the inter-scan distance in the direction in which the scanning is performed stepwise.

9. A preliminary illumination apparatus according to claim 8, wherein said control means further includes means for setting a time interval between scannings performed stepwise in a given direction in accordance with the diameter of the electron beam set by said electron beam intensity adjusting means.

10. A preliminary illumination apparatus according to claim 1, wherein said electron beam intensity adjusting means includes means for adjusting the intensity of said electron beam to an intensity suited for the preliminary irradiation by correspondingly regulating a bias voltage applied to an electron gun included in said illuminating means.

11. An automatic preliminary irradiation apparatus for a transmission electron microscope, comprising:
   an electron gun emitting an electron beam;
   an illuminating lens system for converging said electron beam emitted from said electron gun;
   electron beam diameter enlarging means for enlarging the diameter of said electron beam to such an extent that a region of a specimen within which said specimen is to be preliminarily irradiated can be wholly irradiated by regulating the current supplied to said illuminating lens system; and
   control means for increasing the intensity of said electron beam having the diameter enlarged by said enlarging means at least once after lapse of a predetermined time.

12. An automatic preliminary illumination apparatus according to claim 11, wherein said control means is constituted by control means for controlling a bias voltage of said electron gun.

* * * * *